(12) United States Patent
Kalam

(10) Patent No.: US 10,345,879 B2
(45) Date of Patent: Jul. 9, 2019

(54) CAPACITANCE BASED ACCESSORY CONNECTION DETECTION FOR A BATTERY POWERED UNIT

(71) Applicant: DISH Technologies L.L.C., Englewood, CO (US)

(72) Inventor: Arun Pulasseri Kalam, Bangalore (IN)

(73) Assignee: DISH TECHNOLOGIES L.L.C., Englewood, CO (US)

( * ) Notice: Subject to any disclaimer, the term of this patent is extended or adjusted under 35 U.S.C. 154(b) by 198 days.

(21) Appl. No.: 15/364,022

(22) Filed: Nov. 29, 2016

(65) Prior Publication Data

US 2018/0150118 A1 May 31, 2018

(51) Int. Cl.
| | |
|---|---|
| G06F 1/26 | (2006.01) |
| G06F 1/3209 | (2019.01) |
| H02J 9/00 | (2006.01) |
| H02J 7/00 | (2006.01) |
| H03K 19/20 | (2006.01) |
| H03K 3/037 | (2006.01) |
| G06F 1/3287 | (2019.01) |

(52) U.S. Cl.
CPC ............ *G06F 1/266* (2013.01); *G06F 1/3209* (2013.01); *G06F 1/3287* (2013.01); *H02J 7/0031* (2013.01); *H02J 7/0063* (2013.01); *H02J 9/002* (2013.01); *H03K 3/0375* (2013.01); *H03K 19/20* (2013.01); *G06F 1/263* (2013.01); *H02J 2007/0067* (2013.01); *Y02D 10/171* (2018.01)

(58) Field of Classification Search
CPC ........ G06F 1/266; G06F 1/263; G06F 1/3287; H02J 7/0031; H02J 7/0063
See application file for complete search history.

(56) References Cited

U.S. PATENT DOCUMENTS

| | | | |
|---|---|---|---|
| 2003/0014677 A1* | 1/2003 | Howard | G06F 1/3203 713/323 |
| 2010/0146307 A1* | 6/2010 | Griffin, Jr. | G06F 1/263 713/300 |
| 2013/0007489 A1* | 1/2013 | Unnikrishnan | G06F 1/3209 713/320 |
| 2014/0101345 A1 | 4/2014 | Ranta | |
| 2017/0023995 A1* | 1/2017 | Liepold | G06F 1/32 |

* cited by examiner

*Primary Examiner* — Jaweed A Abbaszadeh
*Assistant Examiner* — Gayathri Sampath
(74) *Attorney, Agent, or Firm* — Seed IP Law Group LLP

(57) ABSTRACT

Devices and methods for detecting the plug-in of an accessory device by a host device are provided. A host device includes a power switch coupled between a battery and a processor. The host device is turned off by a power button coupled to the power switch. A capacitive sensing circuit is coupled to a signal line of a host device port, and is configured to detect a plug-in of the accessory device by monitoring an input capacitance of the signal line. A logic circuit is coupled to an output of the power button and to an output of the capacitive sensing circuit, and the logic circuit turns on the power switch if the power button is in an on position or if the capacitive sensing circuit detects a plug-in of the accessory device.

20 Claims, 3 Drawing Sheets

CAPACITANCE BASED ACCESSORY CONNECTION DETECTION FOR A BATTERY POWERED UNIT

BACKGROUND

Technical Field

This disclosure generally relates to detecting the plugging in of an accessory device to a host device and, more particularly, to turning the host device on from a full shutdown mode in response to the detected plug in of the accessory device.

Description of the Related Art

Power conservation is often a key design constraint in the design of battery powered devices. In particular, such battery powered devices are often designed to conserve as much power as possible (i.e., to reduce power consumption) in order to extend the battery life and the duration of use between charging the battery.

Many battery powered devices, including those having a port for communication with an accessory device, have a low power mode (e.g., a "sleep mode") in which power consumption is reduced while the device is not being actively utilized. Generally, there are two options for the device in such a low power mode: 1. the device does not keep the peripheral (e.g., a host device port for receiving a plug in of an accessory device) operative for detecting the plugging in of an accessory device, because the power consumption of a powered peripheral would be too high; or 2. the device keeps the peripheral powered and drains the battery much faster.

In the first option, the user experience is adversely affected because plugging in an accessory device will not be recognized by the host device until the host device is turned on (e.g., by manually turning on a power button of the host device). In the second option, the user experience may be improved (because the host device will be fully powered up upon detection of a connected accessory device); however, the improved user experience comes with the significant drawback of loss of battery power, which thus limits the usable time of the device per charge.

Accordingly, these an other drawbacks of the conventional technology are overcome by the present disclosure, in which devices and methods for detecting the plugging in of an accessory device are provided that save power and also ensures that the host device will be fully powered up once an accessory device is detected.

BRIEF SUMMARY

The present disclosure generally addresses the issue of turning on a host device (e.g., a set top box, a computer, a television, a mobile device, a video camera etc.) upon detection of the plugging in of an accessory device into a port of the host device, in a way that minimizes power consumption and also ensures that the host device will automatically be turned on (i.e., without any user input) when an accessory is connected.

Most accessory devices available in the market today have an input capacitance, which may detected by appropriate sensing circuitry. The accessory device may be any computerized device including, for example, a USB flash drive, a hard disk drive, a camera, a WiFi dongle or the like. On the host device side, any battery powered host device may include a shutdown option to a main processor or power control circuit that is responsible for powering on the device. When this power button is pressed for some period of time (e.g., a second or a few seconds), the host device powers on (assuming it was initially in an off state).

Once in the off state, the present disclosure provides a solution in which the host device can go into a full shutdown (or extreme low power mode, based on the type of device), but does not need to keep any peripherals running in order to detect the plugging in of an accessory device.

A capacitive sensing circuit is included in the host device and can detect any accessory connection to the host device. The power consumption of the capacitive sensing circuit is negligible as it is a non-switching CMOS device. The capacitive sensing circuit senses the accessory device connection by detecting a change in the input capacitance at the interface connector (e.g., a host device port, such as a USB port). When the capacitive sensing circuit detects a change in input capacitance, it sends a signal to the main processor in order to simulate the long press of the power button, which will power on the host device.

In one embodiment, a host device is provided that includes a battery, a processor and a power switch coupled between the battery and the processor. The power switch is operable to selectively supply electrical power from the battery to the processor. The host device further includes a power button coupled to the power switch and configured to provide power from the battery to the processor when the power button is in an on position, and to completely decouple power from the battery to the processor when the power button is in an off position. A host device port is coupled to a signal line, and the signal line is coupled to an accessory device when the accessory device is electrically coupled to the host device via the host device port. A capacitive sensing circuit is coupled to the signal line of the host device port, and is configured to detect a plug-in of the accessory device by monitoring an input capacitance of the signal line. A logic circuit is coupled to an output of the power button and to an output of the capacitive sensing circuit, and the logic circuit is configured to turn on the power switch if the power button is in an on position or if the capacitive sensing circuit detects a plug-in of the accessory device.

In another embodiment, the present disclosure provides a method that includes: completely decoupling power from a battery of a host device to a processor of the host device; monitoring, by a capacitive sensing circuit in the host device, an input capacitance of a signal line coupled to a host device port; detecting, based on the monitoring, a plug-in of an accessory device into the host device port; and actuating a power switch coupled between the battery and the processor to turn on the host device in response to the detected plug-in of the accessory device.

In yet another embodiment, the present disclosure provides a method that includes: coupling a power switch between a battery and a processor of a host device, the power switch being operable to selectively supply electrical power from the battery to the processor; coupling a power button to the power switch, the power button being configured to provide power from the battery to the processor when the power button is in an on position, and to completely decouple power from the battery to the processor when the power button is in an off position; coupling a host device port to a signal line, the signal line being configured to be coupled to an accessory device when the accessory device is electrically coupled to the host device via the host device port; coupling a capacitive sensing circuit to the signal line of the host device port, the capacitive sensing circuit being configured to detect a plug-in of the accessory device by monitoring an input capacitance of the signal line; and coupling a logic circuit to an output of the power button and to an output of the capacitive sensing circuit, the logic circuit being configured to turn on the power switch if the power button is in an on position or if the capacitive sensing circuit detects a plug-in of the accessory device.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. Well-known structures and methods associated with media content delivery have not been shown or described in detail to avoid unnecessarily obscuring descriptions of the preferred embodiments.

Unless the context requires otherwise, throughout the specification and claims which follow, the word "comprise" and variations thereof, such as, "comprises" and "comprising" are to be construed in an open, inclusive sense, for example, "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. The term "or" is generally employed in its sense including "and/or" unless the content clearly dictates otherwise.

The headings and Abstract of the Disclosure provided herein are for convenience only and do not interpret the scope or meaning of the embodiments.

Embodiments of the present disclosure are directed to devices, systems and methods that minimize power consumption in a host device having an accessory port for communicating with an accessory device.

Figure 1:
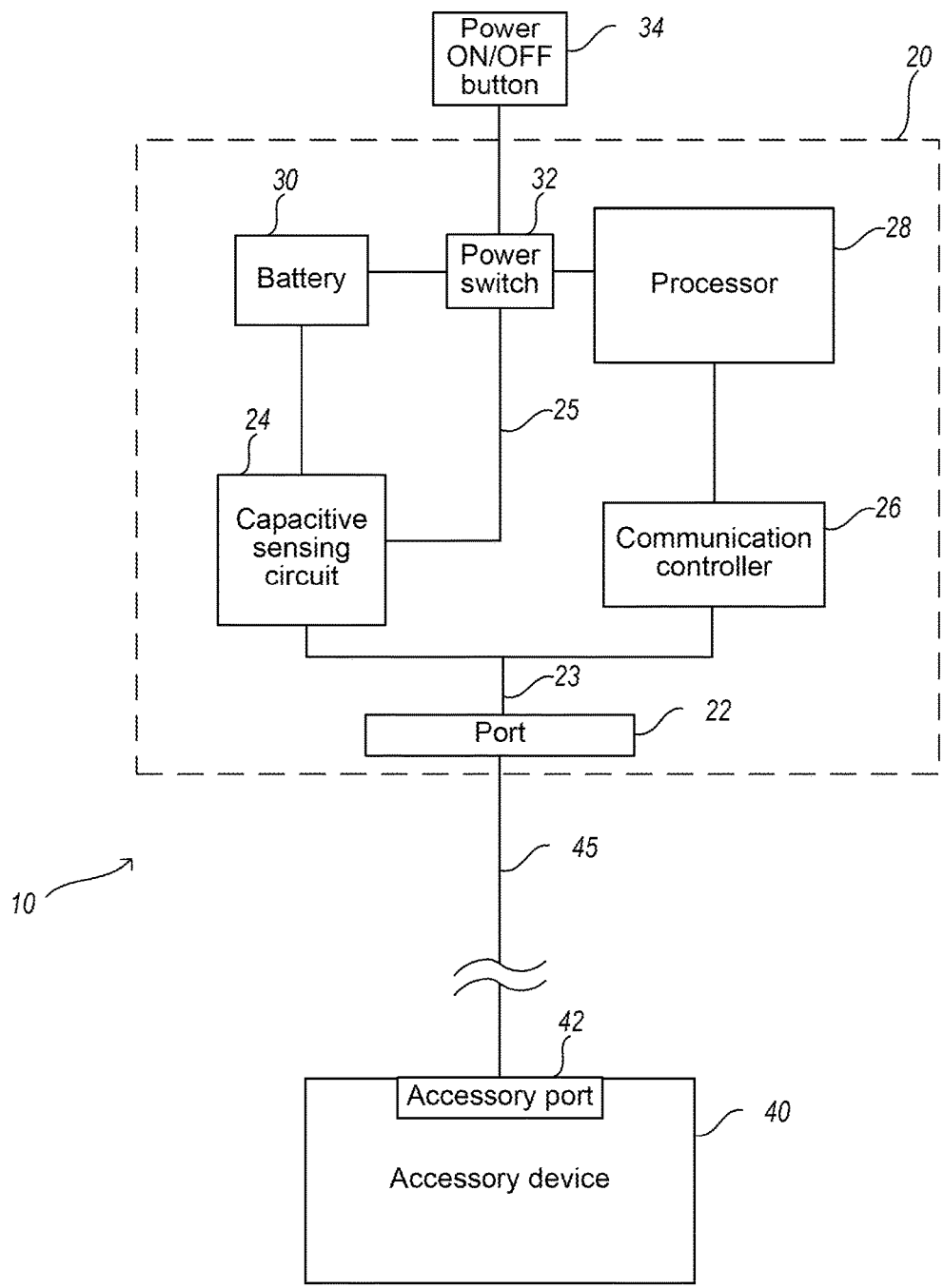
FIG. 1 is a block diagram illustrating an accessory connection detection system, in accordance with an exemplary embodiment of the present disclosure.

FIG. 1 is a block diagram illustrating an accessory connection detection system 10 (which may be referred to herein as simply "system 10") according to an exemplary embodiment of the present disclosure. The system 10 includes a host device 20 that is capable of detecting the plugging-in of an accessory device 40.

The host device 20 includes a port 22 and a capacitive sensing circuit 24 that is coupled to the port 22 and configured to detect an electrical coupling between the host device 20 and the accessory device 40 by monitoring the capacitance on one or more signal lines of the port 22. The accessory device 40 may be electrically coupled to the host device 20 by a cable 45. In one or more embodiments, the cable 45 is not included in the system 10, in which case, the accessory device 40 may include a built-in electrical connector for plugging into the host device port 22 (e.g., a universal serial bus (USB) connector on a flash memory drive, or the like).

The port 22 may be any kind of communications port into which an accessory device 40, or a cable connected to the accessory device 40, may be plugged in, thereby enabling communications between the host device 10 and the accessory device 40. For example, the port 22 may be a USB port, an HDMI port, an Ethernet port, a Firewire port, a VGA port, and so on.

The system 10 supports communication between the host device 10 and the accessory device 40. The host device 20 may be any electronic device that includes a port 22 for receiving a cable 45 or built-in electrical connector of an accessory device 40. The host device 20 may be, for example, a computer device, a mobile device, such as a smart phone, a television, a cable or satellite set top box, a digital video recorder (DVR), a video camera, a television converter, receiver, media player, or the like.

The accessory device 40 may be any electronic device that includes an accessory port 42 for connecting a cable 45, through which the accessory device 40 may communicate with the host device 20. Additionally or alternatively, the accessory device 40 can have a built in electrical connector for direct connection to, and communication with, the host device 40. The accessory device 40 may be any electronic device having an input capacitance measurable via the cable 45, the accessory port 42 and/or the built-in electrical connector. The accessory device 40 may be, for example, a USB flash drive, any electronic device having a USB connection or implementing USB functionality, a computer, a mobile device such as a smart phone, a television, a media player, a hard disk drive or any such computer-readable storage medium, a peripheral device (such as a keyboard, mouse, microphone, speakers, display, etc.), a WiFi dongle or the like.

The host device port 22 includes signal lines for transmitting communication signals between the host device 20 and the accessory device 40. A communication controller 26 is coupled to one or more of the signal lines 23 and controls and/or facilitates communication between the accessory device 40 and the host device 20. For example, the communication controller 26 may process data to be transmitted to, or that is received from, the accessory device 40, in accordance with one or more communications standards and/or protocols, such as may be implemented by USB, HDMI or the like. Further, the communication controller 26 may provide acknowledgement (e.g., ACK) signals to acknowledge receipt of messages from the accessory device 40, collect activity or status data, provide power to an attached accessory device 40 (e.g., 5V for charging via a USB connection), or implement any other such functionality for facilitating communication between the host device 20 and the accessory device 40.

The communication controller 26 is coupled to a host device processor 28, which generally controls the operation of the host device 20 (or, the communication controller 26 may be an integral part of the host device processor 28). For example, the host device processor 28 may be any computer processor coupled to at least one non-transitory memory, and configured to execute computer-executable instructions to carry out, enable and/or otherwise cause performance of any applicable actions by the host device 20 (e.g., presenting video or audio content, accessing data files, recording content, etc.).

The host device 20 may further include a variety of features and functionalities, such as user interface devices, such as buttons, switches, a display, speakers, and the like. Additionally, the receiving device 140 includes recording capability, and may be or include a digital video recorder (DVR).

A power supply 30, which may include one or more batteries, is included in the host device 20 and is coupled to the processor 28 through a switch 32. The switch 32 may be, for example, one or more electronic switches such as transistors or the like. The switch 32 is coupled to a power ON/OFF button 34, which may be a physical button that controls the switch 32 such that when the button 34 is depressed, it turns on or off the host device 20 by coupling or decoupling power from the power source 30 to the processor 28, as well as to any other circuitry included in the host device 20, as may be known in the art. In one or more embodiments, the power switch 32 may be operated based on a control signal received from a remote control device, such as a remote controller for a television, DVR, set top box or the like. That is, the power switch 32 may be activated by a command entered in a remote controller, thereby turning off the host device 20 and completely shutting down the host device 20 by decoupling power to the processor 28 (as well as to any other circuitry in the host device 20, e.g., a power circuit or control circuit responsible for powering on the host device 20, etc.) via the switch 32.

The host device 20 thus can go into a full shutdown mode (or extreme low power mode, based on the type of device), in which power is completely removed from the processor 28, as well as any other circuitry within the host device 20, including peripherals and the like, with the exception of the capacitive sensing circuit 24, as will be discussed in further detail below. Only the capacitive sensing circuit 24, which has negligible power consumption (e.g., on the order of microwatts, nanowatts or picowatts, as it is a non-switching CMOS device) remains coupled to the power supply 30 (e.g., a battery) in the full shutdown mode. To turn the host device 20 on from the full shutdown mode, a user may need to hold down the power ON/OFF button 34 for some period of time, such as more than one or more seconds. In some embodiments, the button 34 may be coupled to time delay circuitry such that the button 34 needs to be depressed (either physically depressed or by a simulated depression, for example, via a remote controller) for two seconds, three seconds or more. In such a case, by holding down the button 34 for some predetermined period of time (set by the time delay circuit, which may be, for example, an RC circuit), the power switch 32 is actuated thereby causing a turn on of the processor 28 and any other circuitry of the host device 20.

A capacitive sensing circuit 24 is coupled to the host device port 22 as a second, different path to turn on the processor 28 and any other circuitry of the host device 20 (i.e., the host device 20 may be turned on via a button press, as described above, and separately may be turned on via the capacitive sensing circuit 24). The capacitive sensing circuit 24 detects the connection of an accessory device 40 by monitoring an input capacitance on one or more of the signal lines 23 to detect when the accessory device 40 is plugged in, e.g., via the cable 45. When a change in input capacitance of the monitored signal line 23 is detected by the capacitive sensing circuit 24, the capacitive sensing circuit 24 transmits an accessory detection signal 25 to the power switch 32, thereby simulating the pressing of the power ON/OFF button 34 sufficient to completely turn on the processor 28 and any other circuitry in the host device 20.

Once the host device 20 has been turned on, in response to the detection of an accessory device 40 being connected, the host device 20 can detect the type of accessory device 40 connected in order to load appropriate functions (e.g., enable the communication controller 26, supply 5V via the communication controller 26 to a line on the port 22 if a USB device is detected, configure the communication controller 26 to implement the appropriate communication protocol, etc.).

Figure 2:
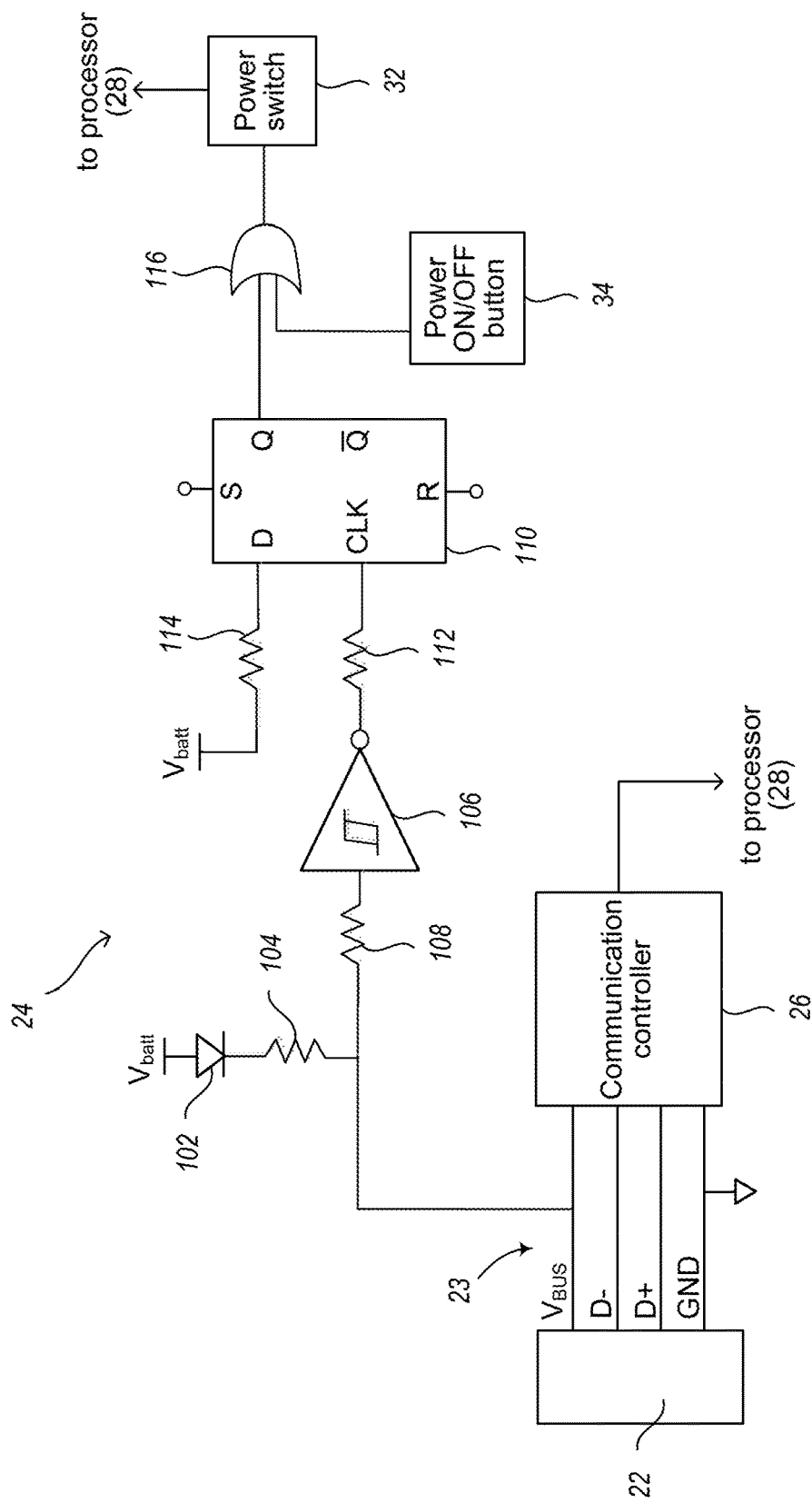
FIG. 2 is a circuit diagram illustrating further details of the capacitive sensing circuit of the system of FIG. 1, in accordance with one or more embodiments of the present disclosure.

FIG. 2 is a circuit diagram illustrating further details of the capacitive sensing circuit 24, in accordance with one or more embodiments. While the capacitive sensing circuit 24 shown in FIG. 2 is configured to detect the plug-in of a USB accessory device, in one or more other embodiments, the capacitive sensing circuit 24 in various other embodiments may be utilized to detect the plugging in of any type of accessory device 40 having an input capacitance.

As shown in FIG. 2, the host device port 22 may be a USB port, which may include a power supply line VBUS, a first data line D−, a second data line D+, and a ground line GND. Additional or alternative signal lines may be included in a USB port, as well as in other types of ports in various other embodiments of the present disclosure.

The communication controller 26 is coupled to the signal lines 23 of the host device port 22 (e.g., to the $V_{BUS}$, D− and D+ lines, as shown) and is configured to communicate with an accessory device 40 (when plugged into the host device port 22) over the signal lines 23.

The capacitive sensing circuit 24 is coupled to one or more of the signal lines 23 (e.g., the $V_{BUS}$ line, as shown) and detects the plug-in of an accessory device 40 by monitoring a change in capacitance on the signal line (e.g., $V_{BUS}$). The $V_{BUS}$ line is provided as an input to the capacitive sensing circuit 24. A diode 102 is coupled to the battery voltage ($V_{batt}$), which may be provided, for example, from the power supply 30.

The input of the capacitive sensing circuit 24 is connected to a particular signal line (e.g., $V_{BUS}$, as shown), where an input capacitance on the accessory device 40 will be present. The capacitive input is pulled up to the battery voltage ($V_{batt}$) with a pull-up resistor 104 coupled to the battery voltage ($V_{batt}$) via the diode 102. The pull-up resistor may be, for example, a 10 k ohm resistor. The capacitive input (i.e., as measured on the $V_{BUS}$ line) is also coupled to a Schmitt trigger inverter 106. An input resistor 108 may be coupled between the input capacitance and the Schmitt trigger inverter 106.

The output of Schmitt trigger inverter 106 is coupled to a first input (e.g., the CLK input) of a D flip flop 110. A resistor 112 may be coupled between the Schmitt trigger inverter 106 output and the first input of the D flip flop 110. A second input (e.g., the data input) of the D flip flop 110 is coupled to the battery voltage ($V_{batt}$), e.g., through another resistor 112.

When the accessory device 40 is plugged into the host device port 22, there will be a dip in the input voltage level at the input of the Schmitt trigger inverter 106 due to the input capacitance of the accessory device 40 as measured on the $V_{BUS}$ signal line. In response to the decrease in the input voltage level at the input of the Schmitt trigger inverter 106, the Schmitt trigger inverter 106 will output a square pulse.

This output square pulse of the Schmitt trigger inverter 106 is provided to the first input (e.g., the clock input) of the D flip flop 110, which then latches the input data value (i.e., the signal at the D input) and outputs (e.g., at the Q output) the latched value. Since the data input of the D flip flop 110 is coupled to the battery voltage ($V_{batt}$), the latched value will be a logic high (e.g., a logic '1').

The output of the D flip flop 110 is provided to a first input terminal of a logic gate 116 (e.g., for performing a logical OR operation), which has a second input terminal configured to receive a signal indicative of a pressing of the power ON/OFF button 34 (which may be provided, for example, as an output of a time delay circuit that outputs a power ON signal in response to the power ON/OFF button 34 being pressed and held for a predetermined period of time, such as a few seconds). Thus, the logic gate 116 will output a signal (e.g., a logic high or '1') in response to the presence of a signal (e.g., a logic high or '1') being received from either the output of the D flip flop 110 (i.e., indicating the plugging in of an accessory device 40) or from the power ON/OFF button 34 (i.e., indicating a user is depressing the button 34 and thereby turning on the host device 40).

The output of the logic gate 116 is provided to the power switch 32 and may be immediately provided to the power switch 32 (i.e., without any time delay requirements, as may be present in one or more embodiments for the host device 20 to turn on in response to pressing of the power ON/OFF button 34) such that the processor 28 and any other circuitry in the host device 20 can be powered on in response to a detected plug-in of the accessory device 40. Once the host device 20 is powered on, one or more power circuits may be turned on, thereby providing power to the host device 20 through one or more separate circuits (e.g., without needing to hold the power switch 32 in an ON state).

The detection of an input capacitance from a plugged in accessory device 40, via the capacitive sensing circuit 24, thus simulates the pressing of the power ON/OFF button 34 in order to power up the host device 20. The processor 28 and any other circuitry in the host device 20 can therefore be turned on based on the capacitive sensing taking place without the power ON/OFF button 34 being depressed at all. Further, the capacitive sensing circuit 24 initiates turn-on of the host device 20 immediately, without any time delay circuitry as may be coupled to the power ON/OFF button 34 in one or more embodiments. That is, the capacitive sensing circuit 24 may cause the host device 20 to turn on the power switch 32 to provide power from the battery 30 to the processor 28 without delay.

The output of the D flip flop is enabled only when the host device 20 is already turned off (e.g., the processor 28 and other circuitry is completely shut down or otherwise decoupled from the power source 30) in order to avoid accidental shut down due to detection of the plugging in of the accessory device 40 when the host device 20 is already turned on.

Once the host device 20 is powered on (e.g., due to the detection of a plugging in of an accessory device 40), it can detect the type of accessory device 40 that has been plugged in, and then can load appropriate functions for controlling and/or communicating with the accessory device 40. For example, the communication controller 26 will be powered up (e.g., through a command and/or power signal provided or facilitated from the processor 28) and will then begin to control or communicate with the accessory device 40 via the signal lines 23 (e.g., the D− and D+ lines) and further may provide power to the accessory device 40 (e.g., provide a 5V signal to the accessory device 40 over the $V_{BUS}$ line in the case where the accessory device 40 is a USB device).

The capacitive sensing circuit 24 ensures that the power consumption of the battery powered host device 20 is extremely low when the host device 20 is turned off (i.e., with the processor 28 and various other circuitry completely decoupled from the power source). At the same time, the host device 20 including the capacitive sensing circuit 24 is able to continually monitor a capacitive input on a signal line 23 of the host device port 22 in order to reliably detect the plugging in of an accessory device 40, and in response, to turn on the host device 20 and power the processor 28 and various other circuitry. This will extend the battery usage duration per charge cycle and further provides a seamless user experience of the host device 20, as plugging in an accessory device 40 will automatically cause the host device 20 to be turned on. Additionally, by using various values of the pull-up resistor 104, the sensitivity of the capacitive sensing circuit 24 may be modified as desired in order to reliably detect the plugging in of various types of devices having an input capacitance.

Alternative logic circuitry may be utilized in the capacitive sensing circuit 24 shown in FIG. 2 in order to produce the same result as described above, i.e., to latch and output an indication of a measured change in input capacitance on the monitored signal line 23 (e.g., $V_{BUS}$) and to logically OR the output of the D flip flop with a signal from the power ON/OFF button 34. For example, in one or more embodiments, the latched output value of the D flip flop may be a logic low in response to sensing a plug-in of an accessory device 40, and the latched output may be provided to a NOR logic gate along with the signal from the power ON/OFF button 34.

In one or more embodiments, the capacitive sensing circuit 24 receives as input a different signal line than the $V_{BUS}$ line. For example, an input capacitance on the D− or D+ lines of a USB port, as well as any lines having an input capacitance of other types of ports, may be monitored and used to sense the plugging in of an accessory device 40.

Figure 3:
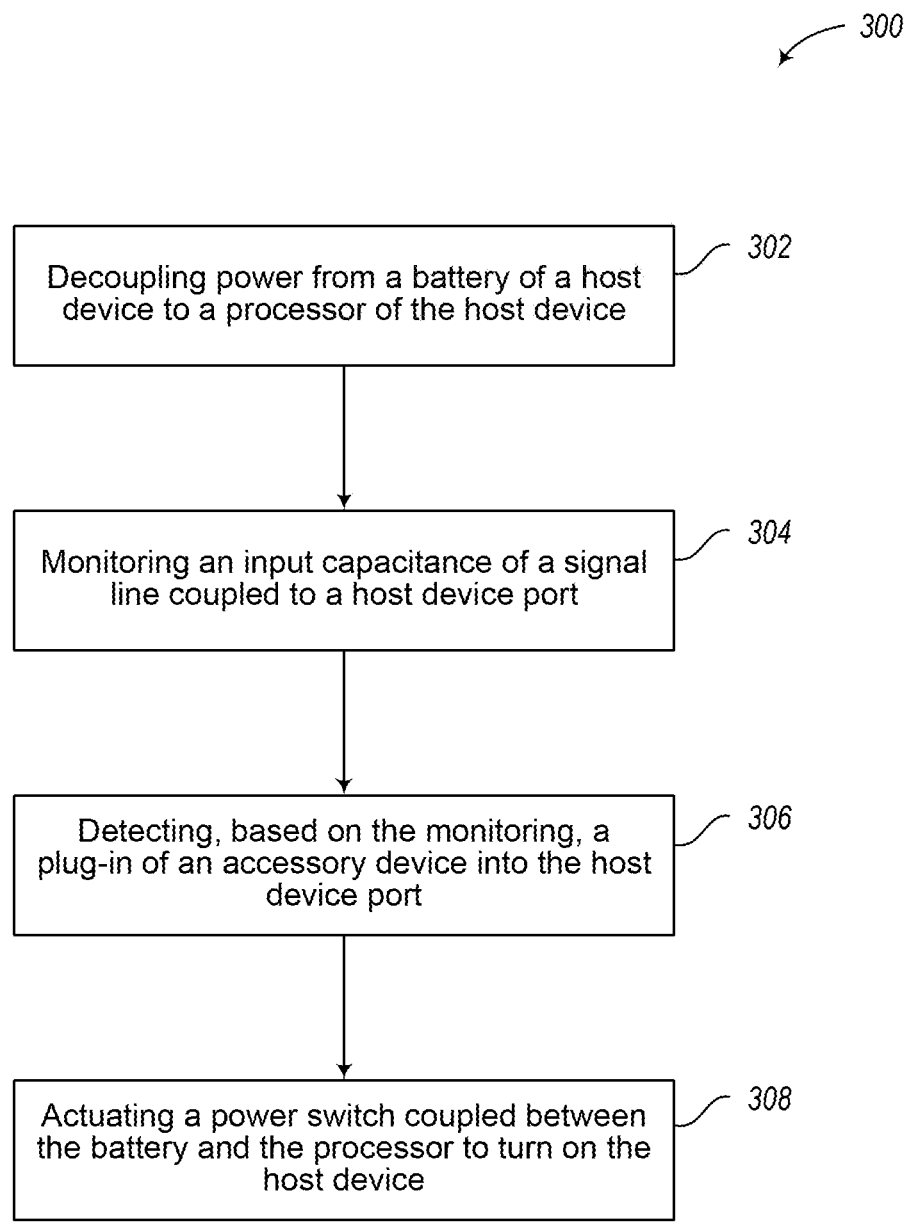
FIG. 3 is a flowchart illustrating a method, in accordance with one or more embodiments of the present disclosure.

FIG. 3 is a flowchart 300 illustrating a method, in accordance with one or more embodiments of the present disclosure.

At block 302, the method begins by completely decoupling power from a battery 30 of a host device 20 to a processor 28 of the host device 20. The power may be decoupled, for example, by activation of the power ON/OFF button 34, which may be accomplished manually or by using a remote controller for the host device 20. When the power ON/OFF button 34 is in an off position, turning on the host device 20 may require a long button press on the ON/OFF button 34, for example, by holding down the button 34 for one or more seconds.

At block 304, the method includes monitoring an input capacitance of a signal line coupled to a host device port 22. The monitoring may be accomplished by a capacitive sensing circuit 24 in the host device 20. The capacitive sensing circuit 24 may monitor any signal line on which an input capacitance is detectable when an accessory device 40 is plugged into the host device port 22. For example, the host device port 22 may be a USB port and the signal line may be a $V_{BUS}$ line.

At block 306, the method includes detecting, based on the monitoring, a plug-in of an accessory device 40 into the host device port 22. The detection of a plug-in of the accessory device 40 is accomplished by the capacitive sensing circuit 24, which may include a Schmitt trigger inverter 106 and a D flip flop 110, as shown in FIG. 2. The Schmitt trigger inverter 106 may sense a dip in input voltage level in the presence of an input capacitance provided by the plugging in of the accessory device 40 (e.g., due to coupling of the input of the Schmitt trigger inverter 106 to battery voltage via the pull-up resistor 104 and the diode 102). The sensed dip in input voltage level may cause the Schmitt trigger 106 to output a pulse (e.g., a square wave) that is received at an input (e.g., the clock input) of the D flip flop 110, which latches a power on signal (e.g., as received at the D input) and outputs the power on signal (i.e., an accessory device detection signal).

At block 308, the method includes actuating a power switch 32 coupled between the battery 30 and the processor 28 to turn on the host device 20, in response to the detected plug-in of the accessory device 40. The power switch 32 may be turned on, for example, by performing a logical OR operation (e.g., by logic gate 116) on a signal received from the power ON/OFF button 34 and an output of the capacitive sensing circuit 24 (e.g., the output accessory detection signal from the D flip flop 110). The power switch 32 may include one or more transistors that are coupled to the power ON/OFF button 34 and to the capacitive sensing circuit 24, for example, through the logic gate 116. Accordingly, the host device 20 will be turned on in response to either the power ON/OFF button 34 being actuated or the detection a plug-in of the accessory device 40 by the capacitive sensing circuit 24.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A host device, comprising:
a battery;
a processor configured to control an operation of the host device;
a power switch coupled between the battery and the processor, the power switch being operable to selectively supply electrical power from the battery to the processor;
a power button coupled to the power switch and configured to provide power from the battery to the processor when the power button is in an on position, and to completely decouple power from the battery to the processor when the power button is in an off position;
a host device port coupled to a signal line, the signal line being coupled to an accessory device when the accessory device is electrically coupled to the host device via the host device port;
a capacitive sensing circuit coupled to the signal line of the host device port, the capacitive sensing circuit being configured to detect a plug-in of the accessory device by monitoring an input capacitance of the signal line;
a logic circuit coupled to an output of the power button and to an output of the capacitive sensing circuit, the logic circuit being configured to turn on the power switch if the power button is in an on position or if the capacitive sensing circuit detects a plug-in of the accessory device.

2. The host device of claim 1, wherein the logic circuit is configured to perform a logical OR operation on the output of the power button and the output of the capacitive sensing circuit.

3. The host device of claim 1, wherein the host device port includes a USB port and the signal line includes a $V_{BUS}$ line of the USB port.

4. The host device of claim 1, wherein the accessory device includes at least one of: a USB device, a computer, a mobile device, a television, a media player, a hard disk drive, a keyboard, a mouse, a microphone, a speaker, a display, and a WiFi dongle.

5. The host device of claim 1, wherein the capacitive sensing circuit includes:
a Schmitt trigger inverter having an input coupled to the signal line of the host device port; and
a D flip flop having a first input coupled to an output of the Schmitt trigger inverter, the D flip flop configured to output an accessory device detection signal based on the output of the Schmitt trigger inverter.

6. The host device of claim 5, wherein the capacitive sensing circuit further includes:
a diode and a first resistor coupled in series between the battery and the input of the Schmitt trigger inverter.

7. The host device of claim 6, wherein the capacitive sensing circuit further includes a second resistor coupled between the output of the Schmitt trigger inverter and the first input of the D flip flop.

8. The host device of claim 7, the capacitive sensing circuit further comprising:
a third resistor coupled between the battery and a second input of the D flip flop.

9. The host device of claim 1, wherein the power button is controllable by manual activation and by remote control activation.

10. A method, comprising:
completely decoupling power from a battery of a host device to a processor of the host device;
monitoring, by a capacitive sensing circuit in the host device, an input capacitance of a signal line coupled to a host device port;
detecting, based on the monitoring, a plug-in of an accessory device into the host device port; and
actuating a power switch coupled between the battery and the processor to turn on the host device in response to the detected plug-in of the accessory device.

11. The method of claim 10, wherein detecting a plug-in of the accessory device into the host device port includes:
sensing a change in voltage level at the signal line by a Schmitt trigger inverter;
latching a power on signal by a D flip flop having a first input coupled to the power on signal and a second input coupled to an output of the Schmitt trigger inverter; and
outputting, by the D flip flop, an accessory device detection signal.

12. The method of claim 11, further comprising:
performing a logical OR operation, by a logic circuit, on an output of a power button and the output accessory device detection signal; and
actuating the power switch based on the logical OR operation.

13. The method of claim 11, wherein monitoring the input capacitance of the signal line includes monitoring the input capacitance of a $V_{BUS}$ line of a USB port.

14. A method, comprising:
coupling a power switch between a battery and a processor of a host device, the power switch being operable to selectively supply electrical power from the battery to the processor;
coupling a power button to the power switch, the power button being configured to provide power from the battery to the processor when the power button is in an on position, and to completely decouple power from the battery to the processor when the power button is in an off position;
coupling a host device port to a signal line, the signal line being configured to be coupled to an accessory device when the accessory device is electrically coupled to the host device via the host device port;
coupling a capacitive sensing circuit to the signal line of the host device port, the capacitive sensing circuit being configured to detect a plug-in of the accessory device by monitoring an input capacitance of the signal line; and
coupling a logic circuit to an output of the power button and to an output of the capacitive sensing circuit, the logic circuit being configured to turn on the power switch if the power button is in an on position or if the capacitive sensing circuit detects a plug-in of the accessory device.

15. The method of claim 14 wherein the capacitive sensing circuit includes a Schmitt trigger inverter and a D flip flop, the method further comprising:
coupling an input of the Schmitt trigger inverter to the signal line of the host device port; and
coupling a first input of the D flip flop to an output of the Schmitt trigger inverter.

16. The method of claim 15 wherein the capacitive sensing circuit further includes a diode and a first resistor, the method further comprising:
coupling the diode and the first resistor in series between the battery and the input of the Schmitt trigger inverter.

17. The method of claim 16 wherein the capacitive sensing circuit further includes a second resistor, the method further comprising:
coupling the second resistor between the output of the Schmitt trigger inverter and the first input of the D flip flop.

18. The method of claim 17 wherein the capacitive sensing circuit further includes a third resistor, the method further comprising:
coupling the third resistor between the battery and a second input of the D flip flop.

19. The method of claim 14, wherein the host device port includes a USB port and the signal line includes a $V_{BUS}$ line of the USB port.

20. The method of claim 14, wherein the accessory device includes at least one of: a USB device, a computer, a mobile device, a television, a media player, a hard disk drive, a keyboard, a mouse, a microphone, a speaker, a display, and a WiFi dongle.

* * * * *